United States Patent
Shin et al.

(10) Patent No.: US 7,785,985 B2
(45) Date of Patent: Aug. 31, 2010

(54) METHODS OF MANUFACTURING SEMICONDUCTOR DEVICES

(75) Inventors: Dong-woon Shin, Gyeonggi-do (KR);
Tai-su Park, Gyeonggi-do (KR);
Si-young Choi, Gyeonggi-do (KR);
Soo-jin Hong, Gyeonggi-do (KR);
Mi-jin Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 183 days.

(21) Appl. No.: 12/133,772

(22) Filed: Jun. 5, 2008

(65) Prior Publication Data

US 2009/0203188 A1 Aug. 13, 2009

(30) Foreign Application Priority Data

Feb. 13, 2008 (KR) .................... 10-2008-0013008

(51) Int. Cl.
*H01L 21/76* (2006.01)
(52) U.S. Cl. .................. 438/435; 438/424; 438/427
(58) Field of Classification Search .......... 438/424, 438/427, 435
See application file for complete search history.

(56) References Cited

U.S. PATENT DOCUMENTS 5,616,401 A * 4/1997 Kobayashi et al. .......... 428/212
6,642,125 B2 * 11/2003 Oh et al. .................... 438/427
2004/0212035 A1 * 10/2004 Yeo et al. .................... 257/510

FOREIGN PATENT DOCUMENTS

| JP | 2005-159211 | 6/2005 |
| KR | 1020070049340 A | 5/2007 |
| KR | 100729911 B1 | 6/2007 |

* cited by examiner

*Primary Examiner*—Phuc T Dang
(74) *Attorney, Agent, or Firm*—Myers Bigel Sibley & Sajovec (57) ABSTRACT

Methods of manufacturing a semiconductor device, which can reduce hot electron induced punchthrough (HEIP) and/or improve the operating characteristics of the device include selectively forming an oxynitride layer in a device isolation layer according to the characteristics of transistors isolated by the device isolation layer. The methods include forming first trenches and second trenches on a substrate, forming an oxide layer on the surfaces of the first trenches and the second trenches, selectively forming an oxynitride layer on the second trenches by using plasma ion immersion implantation (PIII), and forming a buried insulating layer in the first trenches and the second trenches. The buried insulating layer may be planarized to form a first device isolation layer in the first trenches and a second device isolation layer in the second trenches.

19 Claims, 7 Drawing Sheets

METHODS OF MANUFACTURING SEMICONDUCTOR DEVICES

CROSS-REFERENCE TO RELATED PATENT APPLICATION

This application claims priority under 35 U.S.C. §119 from Korean Patent Application No. 10-2008-0013008, filed on Feb. 13, 2008, in the Korean Intellectual Property Office, the disclosure of which is incorporated herein in its entirety by reference.

BACKGROUND

1. Field of the Invention

The present invention relates to methods of manufacturing semiconductor devices, and more particularly, to methods of manufacturing semiconductor devices, which can reduce hot electron induced punch-through (HEIP) and/or improve operating characteristics of the semiconductor device.

2. Description of the Related Art

In general, semiconductor devices can include an active region in which unit devices are formed, and a device isolation region that defines the active region. The device isolation region can account for a large proportion of a total area of semiconductor devices, and thus miniaturization of the device isolation region can be desired for high integration of semiconductor devices. In addition, in order to ensure that devices operate properly, a device isolation region can have a structure that can reduce or prevent interference between devices and/or decrease junction capacitance. In the past, a local oxidation of silicon (LOCOS) type oxide layer was used as a device isolation layer in semiconductor devices, but currently, shallow trench isolation (STI) type device isolation layers, that can have a narrow width and excellent device isolation properties, are widely used.

Figure 1:
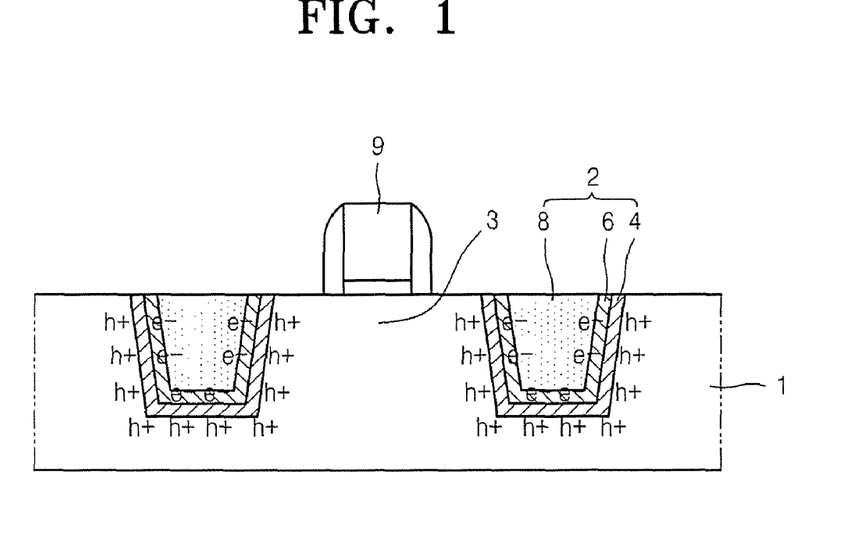
FIG. 1 is a schematic cross-sectional view of a semiconductor device including a conventional shallow trench isolation (STI) type device isolation layer.

FIG. 1 is a schematic cross-sectional view of a semiconductor device including a conventional STI type device isolation layer.

Referring to FIG. 1, device isolation layers 2 are formed in a substrate 1. An active region 3 including a source/drain region and a channel region is formed between the device isolation layers 2, and a gate structure 9 is formed on the active region 3. Such device isolation layers 2 are formed as trenches filled with insulating material, and thus electrically separate the devices from each other. As illustrated in FIG. 1, in order to improve refresh characteristics of a semiconductor device, a silicon oxide layer 4 and a silicon nitride layer 6 are generally formed on inner walls of a device isolation layer trench. And then, the device isolation trench is filled with a buried layer 8 having a gap fill material such as spin-on-glass (SOG).

However, the silicon nitride layer 6 may trap electrons, and thus electrons may be trapped at an interface between the silicon oxide layer 4 and the silicon nitride layer 6. As a result of the trapped electrons, holes can become concentrated in a region of the substrate 1 adjacent to the device isolation layer 2. This can lead to a phenomenon referred to as hot electron induced punch-through (HEIP). Due to HEIP, current can flow in a device even when a voltage is not applied to a gate, and thus a threshold voltage can be decreased and leakage current can be increased, potentially resulting in defective devices. Such a HEIP phenomenon can be especially problematic in a p-channel metal-oxide-semiconductor (p-MOS) devices in which holes are the major carrier and a programming voltage Vpp is applied at a high voltage. In particular, off-current characteristics of a device can be degraded. To address these problems, a method of removing the nitride layer from a device isolation layer of a p-MOS device has been proposed in order to reduce/prevent electrons from becoming trapped in a silicon nitride layer. However, when etching is used for removing the nitride layer, other layers of the device may be damaged.

SUMMARY

Some embodiments provide methods of manufacturing a semiconductor device, which can reduce hot electron induced punch-through (HEIP) and/or improve the operating characteristics of the device, by selectively forming an oxynitride layer in a device isolation layer with respect to the characteristics of transistors.

According to some embodiments, methods of manufacturing a semiconductor device include forming first trenches and second trenches on a substrate, forming an oxide layer on surfaces of the first trenches and the second trenches, forming an oxynitride layer on the second trenches by using plasma ion immersion implantation (PIII), and forming a buried insulating layer in the first trenches and the second trenches. In some embodiments, the buried insulating layer may be planarized to form a first device isolation layer in the first trenches and a second device isolation layer in the second trenches.

Forming of the oxynitride layer may further include forming a photoresist pattern on the substrate to expose the second trenches, nitriding the oxide layer formed on the surface of the exposed second trenches by using plasma ion immersion implantation (PIII) to form the oxynitride layer, and removing the photoresist pattern.

The plasma ion immersion implantation (PIII) may be performed at a temperature ranging from 10° C. to 200° C. The oxynitride layer may be formed as a single layer or a multi-layer in which an oxide layer and a nitride layer are stacked. In addition, the concentration of nitrogen in the oxynitride layer may be uniform or variable with respect to the thickness thereof. In addition, the methods may further include heat treating the first and second trenches, the oxide layer, and the oxynitride layer in a inert gas atmosphere.

A region on the substrate between the first device isolation layers may include a p-channel metal-oxide-semiconductor (p-MOS) region in which a p-MOS transistor is formed, and a region on the substrate between the second device isolation layers may include an n-channel metal-oxide-semiconductor (n-MOS) region in which an n-MOS transistor is formed.

Some of the second trenches may include third trenches, wherein a portion of the oxide layer formed on the surface of the third trenches may be nitrided to form the oxynitride layer, and wherein third device isolation layers may be formed in the third trenches. In addition, regions on the substrate between the first device isolation layers and a portion of the third device isolation layers having the oxide layer and not the oxynitride layer formed therein may include a p-MOS region in which a p-MOS transistor is formed, and regions on the substrate between the second device isolation layers and a portion of the third device isolation layers having the oxynitride layer formed therein may include an n-MOS region in which an n-MOS transistor is formed.

Further embodiments provide methods of manufacturing a semiconductor device including defining a cell region and a peripheral region in a substrate, forming first peripheral region trenches and second peripheral region trenches on the peripheral region, forming cell region trenches on the cell region, forming an oxide layer on surfaces of the first peripheral region trenches, the second peripheral region trenches, and the cell region trenches, forming an oxynitride layer on the second peripheral region trenches and the cell region trenches using plasma ion immersion implantation (PiII), forming a buried insulating layer in the first peripheral region trenches, the second peripheral region trenches, and the cell region trenches, and planarizing the buried insulating layer to form a first peripheral region device isolation layer in the first peripheral region trenches, a second peripheral region device isolation layer in the second peripheral region trenches, and a cell region device isolation layer in the cell region trenches.

The sizes of the first peripheral region trenches and the second peripheral region trenches may be larger than the size of the cell region trenches.

Forming the oxynitride layer may further include forming a photoresist pattern on the substrate to expose the second peripheral region trenches and the cell region trenches, nitriding the oxide layer formed on the surfaces of the exposed second peripheral region trenches and the cell region trenches using plasma ion immersion implantation (PaII) to form the oxynitride layer, and removing the photoresist pattern.

The plasma ion immersion implantation (PiII) may be performed at a temperature ranging from 10° C. to 200° C. The oxynitride layer may be formed as a single layer or a multi-layer in which an oxide layer and a nitride layer are stacked. In addition, when the oxynitride layer is formed as a single layer, the concentration of nitrogen in the oxynitride layer is uniform or variable with respect to the thickness thereof. In addition, between forming the oxynitride layer and forming the buried insulating layer, the methods may further include heat treating the first peripheral region trenches, the second peripheral region trenches, the cell region trenches, the oxide layer, and the oxynitride layer in a inert gas atmosphere.

Regions on the substrate, which are formed between the first peripheral region device isolation layers may have a p-MOS region in which a p-MOS transistor is formed, regions on the substrate, which are formed between the second peripheral region device isolation layers may have an n-MOS region in which an n-MOS transistor is formed, and regions on the substrate, which are formed between the cell region device isolation layers may have an n-MOS region in which an n-MOS transistor is formed.

Some of the second peripheral region trenches may include third peripheral region trenches, wherein a part of the oxide layer formed on the surface of the third peripheral region trenches may be nitrided to form the oxynitride layer, and wherein third device isolation layers may be formed in the third peripheral region trenches. In addition, regions on the substrate between the first peripheral region device isolation layers and a portion of the third peripheral region device isolation layers having the oxide layer and not the oxynitride layer formed therein may include a p-MOS region in which a p-MOS transistor is formed, and regions on the substrate between the second peripheral region device isolation layers and a portion of the third peripheral region device isolation layers having the oxynitride layer formed therein may include an n-MOS region in which an n-MOS transistor is formed.

The methods may further include forming a pad insulating layer on the substrate.

Methods according to further embodiments include forming first trenches and second trenches in a substrate, forming an oxide layer on surfaces of the first trenches and the second trenches, selectively forming an oxynitride layer on the second trenches, wherein the oxynitride layer does not extend onto at least portions of the first trenches, and forming an insulating layer in the first trenches and the second trenches.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In general, a semiconductor memory device may include transistors in a cell array region and transistors in a core circuit region/peripheral circuit region, which can operate and control the transistors in the cell array region. In addition, since a different design rule may be applied to each circuit region depending on the required degree of integration, the material and structure of transistors formed in each circuit region may be different from each other. Hereinafter, the core circuit region/peripheral circuit region is referred to as a peripheral region 100, and the cell array region is referred to as a cell region 200. In addition, a shallow trench isolation (STI) type device isolation layer is briefly referred to as a device isolation layer.

FIGS. 2A through 2G are cross-sectional views sequentially illustrating methods of manufacturing a semiconductor device including an STI-type device isolation layer, according to some embodiments of the present invention.

Figure 2A:
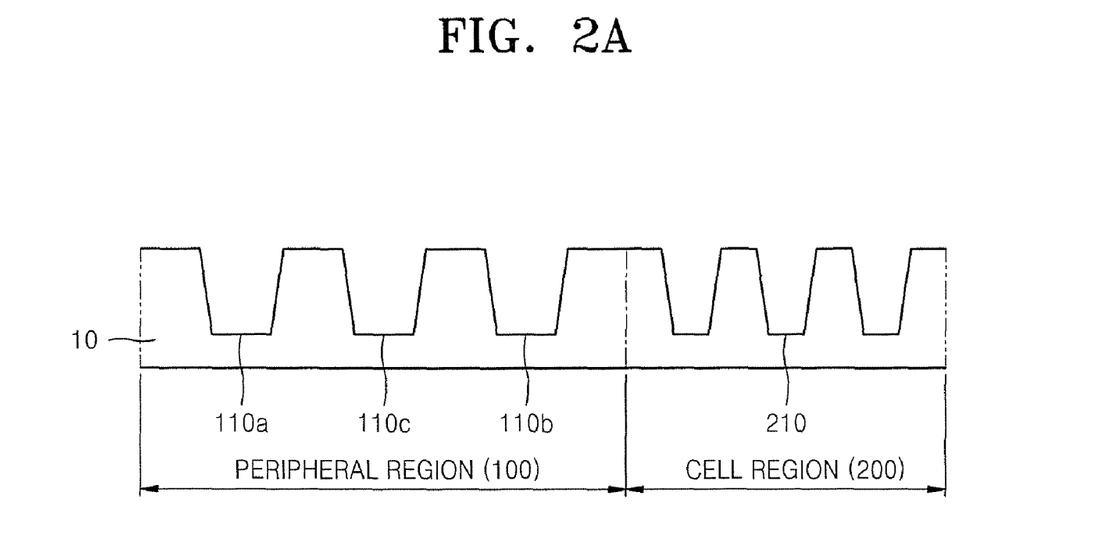
FIGS. 2A through 2G are cross-sectional views sequentially illustrating methods of manufacturing a semiconductor device including an STI-type device isolation layer, according to embodiments of the present invention.

Referring to FIG. 2A, a substrate 10 is prepared. As illustrated in FIG. 2A, a peripheral region 100 and a cell region 200 may be defined in the substrate 10. Hereinafter, the substrate 10 in which the peripheral region 100 and the cell region 200 are defined is employed as an example for describing methods according to some embodiments of the present invention,. However, the present invention is not limited thereto.

Next, first through third peripheral region trenches 110a, 110b and 110c, and cell region trenches 210, are respectively formed in the peripheral region 100 and the cell region 200 of the substrate 10. The first through third peripheral region trenches 110a, 110b and 110c, and the cell region trenches 210, may be formed simultaneously and/or in separate processes. The first through third peripheral region trenches 110a, 110b and 110c, and the cell region trenches 210, may be formed using conventional etching methods, which may include the use of a photoresist mask or a hard mask, and the use of wet etching, and/or dry etching. Examples of the etching methods that can be used for forming the first through third peripheral region trenches 110a, 110b and 110c and the cell region trenches 210 include anisotropic etching, such as reactive ion etching (RIE) or plasma etching, or sloped etching. However, these examples are for illustration purposes only, and the present invention is not limited thereto. In addition, the first through third peripheral region trenches 110a, 110b and 110c are classified according to the structure of layers formed on the surface thereof, and the shapes and/or sizes thereof are not limited. That is, the first through third peripheral region trenches 110a, 110b and 110c may have shapes and/or sizes the same as or different from each other. In addition, the shapes and/or sizes of the first peripheral region trenches 110a may be the same as or different from each other. This also applies to the second peripheral region trenches 110b, the third peripheral region trenches 110c, and the cell region trenches 210. The sizes of the first through third peripheral region trenches 110a, 110b and 110c may be larger than that of the cell region trenches 210. Herein, the size refers to the width and/or depth of the trenches.

Figure 2B:
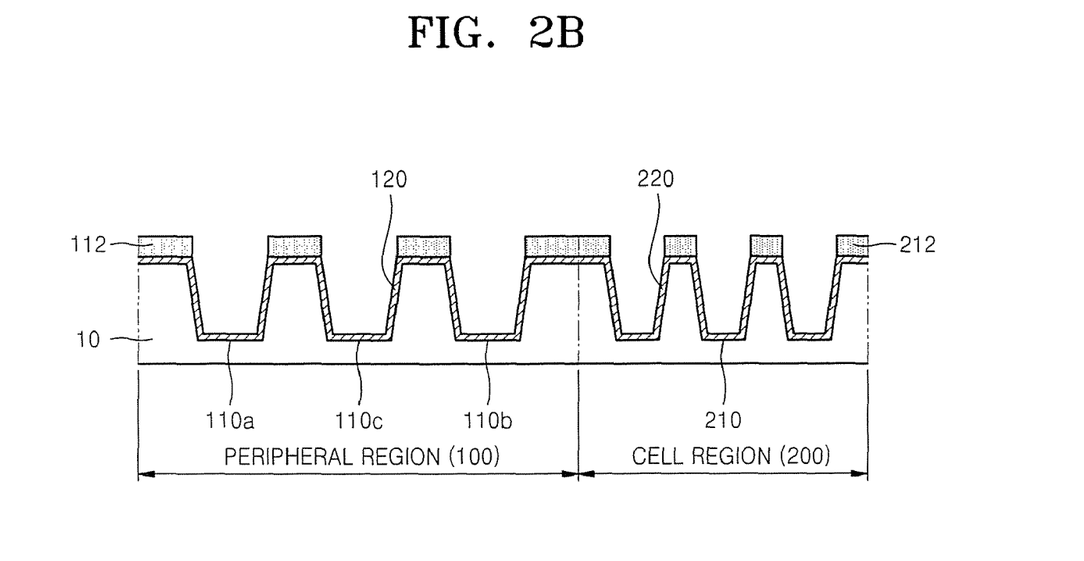

Referring to FIG. 2B, oxide layers 120 and 220 are respectively formed on the surfaces of the first through third peripheral region trenches 110a, 110b and 110c and cell region trenches 210. The surfaces of the first through third peripheral region trenches 110a, 110b and 110c and cell region trenches 210 include inner wall surfaces and bottom surfaces. The oxide layers 120 and 220 may be formed on the surfaces of the first through third peripheral region trenches 110a, 110b and 110c and cell region trenches 210 simultaneously and/or in separate processes. In addition, the widths and/or materials of the oxide layers 120 and 220 may be the same as or different from the widths and/or materials of the first through third peripheral region trenches 110a, 110b and 110c and cell region trenches 210. The oxide layers 120 and 220 may include a typical sidewall oxide layer, and/or a multi-layer including a sidewall oxide layer and a mid temperature oxide (MTO) layer. The MTO layer may be used for forming oxynitride layers 150 and 250 (FIG. 2D) in subsequent processes. The oxide layers 120 and 220 may include silicon oxide layers; however, the present invention is not limited thereto. In addition, the oxide layers 120 and 220 may be formed using a silane-based gas, for example, $SiH_4$, $Si_2Cl_2H_2$, $SiH_6$, $Si_2H_6$, or $Si_3H_8$ or a mixed gas thereof. In some embodiments, the oxide layers 120 and 220 may be formed using $O_2$, $N_2$, Ar, He, or a mixed gas thereof. In addition, the oxide layers 120 and 220 may be formed using thermal oxidation, rapid thermal oxidation (RTO), and/or chemical vapor deposition (CVD) processes. However, the oxide layers 120 and 220 as described above are for illustration purposes only, and the types thereof are not limited to the above-described examples. The oxide layers 120 and 220 can reduce or prevent defects in sidewalls of the first through third peripheral region trenches 110a, 110b and 110c and the cell region trenches 210.

In addition, pad insulating layers 112 and 212 may be optionally further formed on the substrate 10. The pad insulating layers 112 and 212 may be formed prior to or after the formation of the oxide layers 120 and 220. The pad insulating layers 112 and 212 may include a silicon oxide layer, a silicon nitride layer, or a silicon oxynitride layer, or a multi-layer thereof. As illustrated in FIG. 2B, in the case of sequentially forming the oxide layers 120 and 220 and the pad insulating layers 112 and 212 on the substrate 10, the pad insulating layers 112 and 212 can protect the oxide layers 120 and 220 from being damaged in subsequent processes. Thus, a part of the oxide layers 120 and 220 may be used as a gate insulating layer. In addition, the pad insulating layers 112 and 212 may be used as a planarization blocking layer in a subsequent planarization process, for example, in a chemical-mechanical polishing (CMP) process.

Figure 2C:
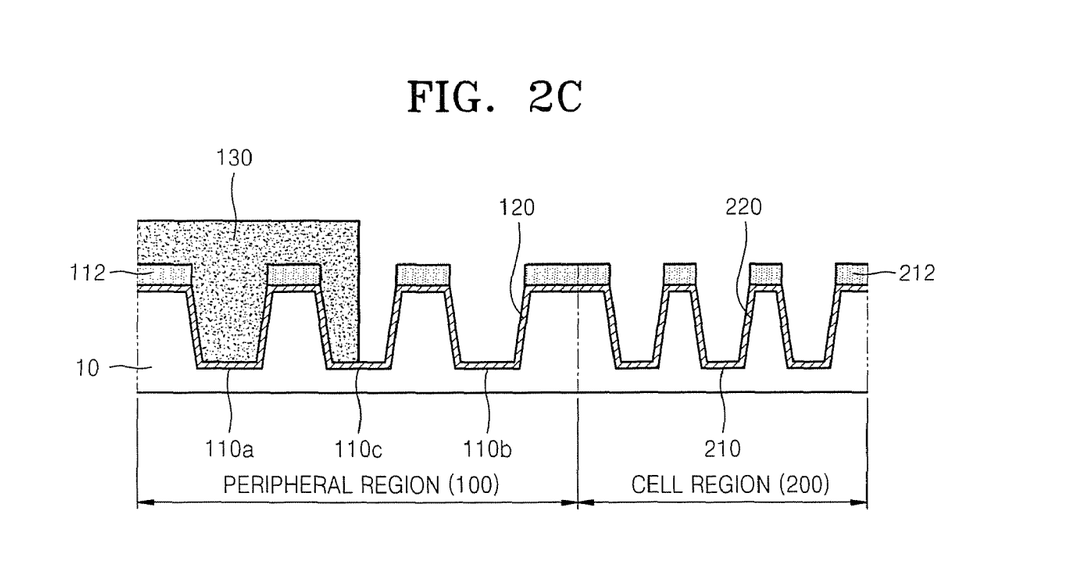
Figure 2D:
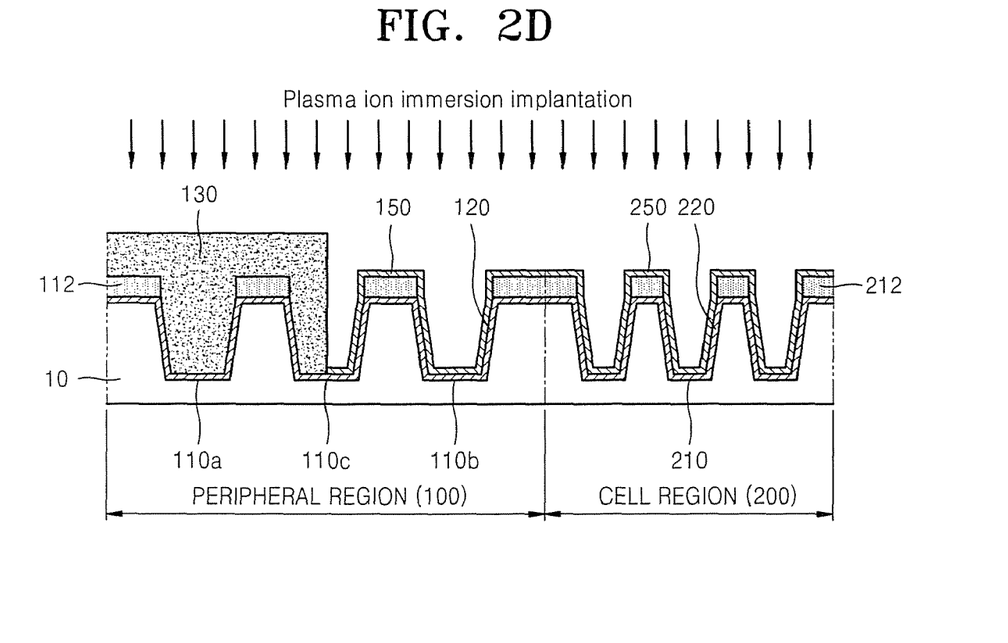

Referring to FIGS. 2C and 2D, oxynitride layers 150 and 250 are formed on some regions of the oxide layers 120 and 220, for example, on the second peripheral region trenches 110b and the cell region trenches 210, by plasma ion immersion implantation (PIII). The use of PIII will be described later in more detail.

Formation of the oxynitride layers 150 and 250 will now be described. Referring to FIG. 2C, a photoresist layer (not shown) is formed on an entire surface of the substrate 10 on which the oxide layers 120 and 220 are formed, or on which the oxide layers 120 and 220 and the pad insulating layers 112 and 212 are formed. The photoresist layer is patterned to form a photoresist pattern 130 to expose the second peripheral region trenches 110b, the cell region trenches 210, and a portion of the third peripheral region trenches 110c. The photoresist layer may be patterned using methods commonly known in the art. The photoresist pattern 130 blocks the first peripheral region trenches 110a from the outside.

Referring to FIG. 2D, the oxide layers 120 and 220, which are formed on the surface of the second peripheral region trenches 110b and the cell region trenches 210 and are then exposed by the photoresist pattern 130, are selectively nitrided by using PIII to form the oxynitride layers 150 and 250. The oxynitride layers 150 and 250 may be a silicon oxynitride layer (SiON); however, the present invention is not limited thereto. In addition, the oxynitride layers 150 and 250 may be formed as a single layer or a multi-layer in which an oxide layer and a nitride layer are stacked. The concentration of nitrogen in the oxynitride layers 150 and 250 may be uniform or variable with respect to the thickness thereof. For example, the concentration of nitrogen in the oxynitride layers 150 and 250 may be gradually increased and/or decreased in a direction from the surface of the oxynitride layers 150 and 250 to the substrate 10. In addition, the oxide layers 120 and 220 and the oxynitride layers 150 and 250 are illustrated as being separately formed. However, this is for illustration purposes only, and the present invention is not limited to the above example. That is, the oxide layers 120 and 220 and the oxynitride layers 150 and 250 may be formed as a single layer.

For example, the oxynitride layers 150 and 250 may be formed by plasma enhanced chemical vapor deposition (PECVD) and/or radical nitridation. The formation of the oxynitride layers 150 and 250 may be performed at a pressure ranging from 0.01 to 10 Torr, by using a nitrogen-based reactive gas, for example, at least one of $N_2$, NO, $N_2O$, and $NH_3$, or by using a mixed gas of at least one of the nitrogen-based reactive gases described above and at least one source gas selected from the group consisting of $SiH_4$, $Si_2Cl_2H_2$, $SiH_6$, $Si_2H_6$, and $Si_3H_8$, and in an Ar, He, or the like atmosphere. However, these examples are for illustration purposes only, and the present invention is not limited thereto.

In addition, the PIII may be performed at a temperature ranging from 10 to 200° C. However, the PIII is described for illustration purposes only, and any method that can be performed at a temperature ranging from 10 to 200° C. to form the oxide layer or the oxynitride layer may be used. Since the oxynitride layers 150 and 250 are formed at a low temperature, the photoresist patterns 130 and 230 may be used as a deposition mask.

Figure 2E:
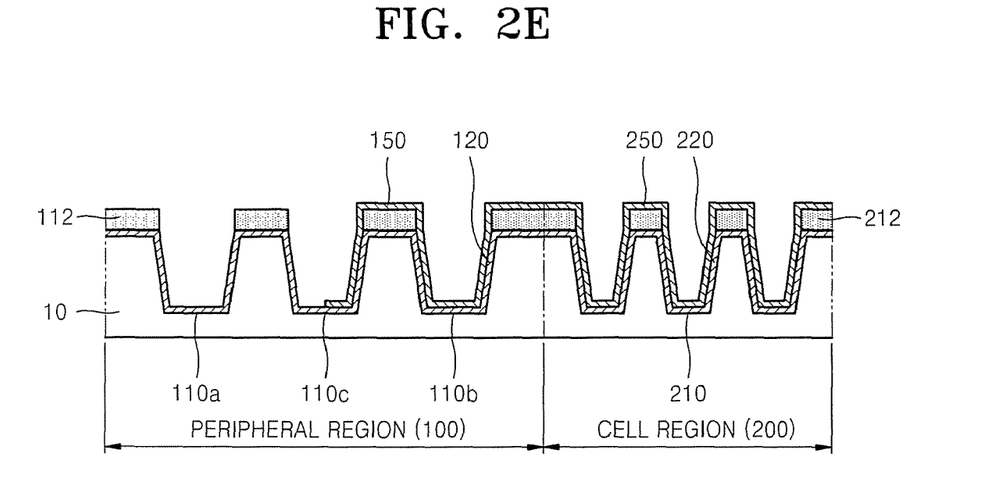

Referring to FIG. 2E, the photoresist pattern 130 is removed using a conventional method, for example, ashing or stripping. In addition, prior to the removing of the photoresist pattern 130, a nitride layer (not shown) formed on the photoresist pattern 130 may be optionally removed by using dry etching.

After forming the oxynitride layers 150 and 250, the oxide layers 120 and 220 and the oxynitride layers 150 and 250, my be heat treated in an atmosphere including an inert gas, such as helium or argon.

The oxynitride layer 150 formed in the third peripheral trenches 110c will now be described. As in the case of the second peripheral region trenches 110b described above, the oxide layer 120 that is formed on the surface of the third peripheral region trench 110c and exposed by the photoresist pattern 130 is selectively nitrided by using PIII to form the oxynitride layer 150. However, unlike the second peripheral region trenches 110b, a part of the oxide layer 120 formed on the surface of the third peripheral region trenches 110c is exposed by the photoresist pattern 130. Accordingly, as illustrated in FIG. 2D, one portion of the third peripheral region trenches 110c has the oxide layer 120 and the oxynitride layer 150 formed thereon, and the other portion thereof has only the oxide layer 120 formed thereon, because the other portion thereof is blocked by the photoresist pattern. Whether to form the third peripheral region trenches 110c having layers formed thereon, which have such an asymmetric structure, is optional.

Figure 2F:
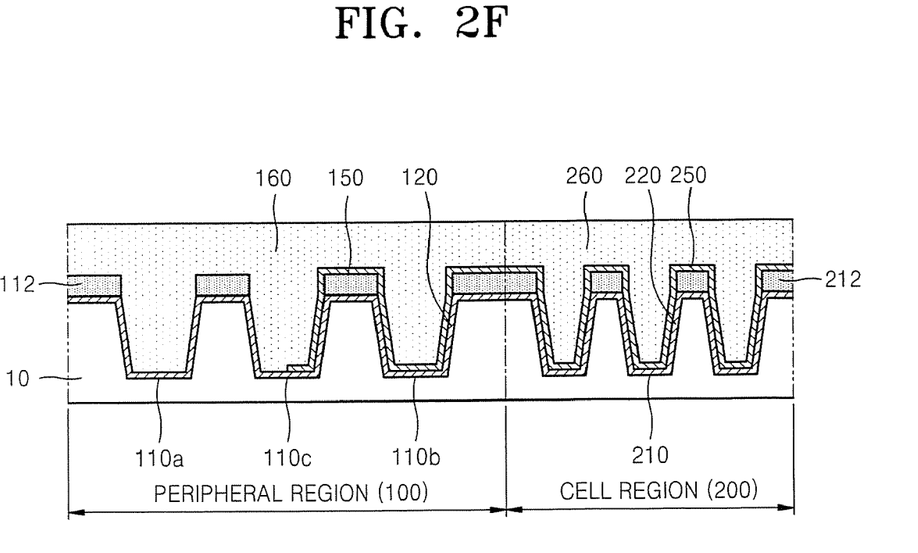

Referring to FIG. 2F, buried insulating layers 160 and 260 are formed in the first through third peripheral region trenches 110a, 110b and 110c and the cell region trenches 210. The buried insulating layers 160 and 260 may include an oxide layer, for example, spin-on-glass (SOG) or undoped silica glass (USG). In addition, the buried insulating layers 160 and 260 may be formed by high density plasma CVD (HDP-CVD), $O_3$-TEOS atmospheric pressure CVD ($O_3$-TEOS APCVD), $O_3$-TEOS Sub-APCVD, atomic layer CVD (AL-CVD), and/or molecular layer CVD (MLCVD).

Figure 2G:
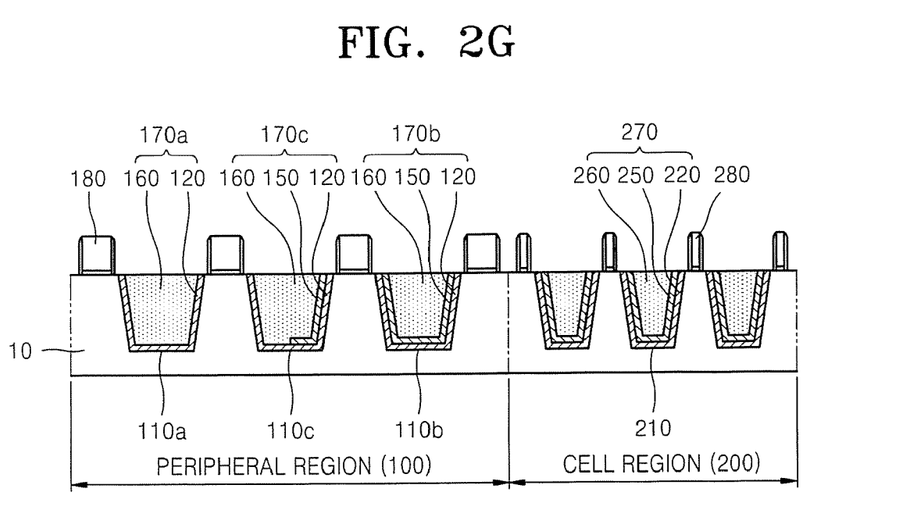

Referring to FIG. 2G, the buried insulating layers 160 and 260 are planarized by chemical-mechanical polishing (CMP) and/or an etch-back process to respectively form first through third peripheral region device isolation layers 170a, 170b and 170c in the first through third peripheral region trenches 110a, 110b and 110c and cell region device isolation layers 270 in the cell region trenches 210. Subsequently, peripheral region gate structures 180 are formed on regions on the substrate 10 between the first through third peripheral region device isolation layers 170a, 170b, and 170c. In addition, cell region gate structures 280 are formed on regions on the substrate 10 between the cell region device isolation layers 270. The peripheral region gate structures 180 and the cell region gate structures 280 may be used to form a conventional transistor, a transistor of a conventional static random access memory (SRAM) or dynamic random access memory (DRAM) device, a transistor of a flash memory device, etc.

Regions on the substrate 10 between the first peripheral region device isolation layers 170a may include a p-channel metal-oxide-semiconductor (p-MOS) region in which a p-MOS transistor is formed. Regions on the substrate 10 between the second peripheral region device isolation layers 170b may include an n-channel metal-oxide-semiconductor (n-MOS) region in which an n-MOS transistor is formed. In addition, regions on the substrate 10 between the cell region device isolation layers 270 may include an n-MOS region in which an n-MOS transistor is formed. In addition, when the third peripheral region device isolation layers 170c are included, regions on the substrate 10 between the first peripheral region device isolation layers 170a and a portion of the third peripheral region device isolation layers 170c on which the oxynitride layer 150 is not formed may include a p-MOS region in which a p-MOS transistor is formed. In addition, regions on the substrate 10 between the second peripheral region device isolation layers 170b and a portion of the third peripheral region device isolation layers 170c on which both the oxide layer 120 and the oxynitride layer 150 are formed may include an n-MOS region in which an n-MOS transistor is formed. That is, device isolation layers that define an active region in the substrate 10 for forming the p-MOS transistor, i.e., the first peripheral region device isolation layers 170a, do not have the oxynitride layer 150 thereon, and have only the oxide layer 120 formed thereon. In addition, device isolation layers that define an active region in the substrate 10 for forming the n-MOS transistor, that is, the second peripheral region device isolation layers 170b or the cell region device isolation layers 270 have both the oxide layers 120 and 220 and the oxynitride layers 150 and 250 formed thereon. Also, in the case of the third peripheral region device isolation layers 170c having an asymmetric layer structure including the oxynitride layer 150 on a portion of the surface thereof, the active region in the substrate 10 for forming the p-MOS transistor is defined adjacent to the region on which only the oxide layer 120 is formed in the third peripheral region device isolation layers 170c, while the active region in the substrate 10 for forming the n-MOS transistor is defined adjacent to the region on which both the oxide layer 120 and the oxynitride layer 150 are formed in the third peripheral region device isolation layers 170c.

The structures described above may have the following sizes. First, the first through third peripheral region trenches 110a, 110b and 110c and the cell region trenches 210 may each have a depth of 1000 to 3000 Å. The pad insulating layers 112 and 212 may each have a thickness of 50 to 1000 Å. The oxide layers 120 and 220 may each have a thickness of 50 to 200 Å. The oxynitride layers 150 and 250 may each have a thickness of 50 to 100 Å. The buried insulating layers 160 and 260 may each have a thickness of 3000 to 6000 Å. However, the sizes described above are for illustration purposes only, and the present invention is not limited thereto.

Therefore, the oxynitride layer is selectively formed in the device isolation layer only in the n-MOS region, and thus formation of a charge trap in the p-MOS can be avoided.

Hereinafter, The PIII process will be described in more detail. The PIII process is a method in which plasma-state ions are excited by bias voltage applied from the outside and/or by the plasma itself, thereby being accelerated and implanted into a substrate. A layer may be deposited using the PIII process, and such a method is referred to as plasma ion immersion implantation and deposition (PIIID). PIII or PIIID is named according to whether or not a layer is formed by deposition, and the basic principle of PIII is similar to that of PIIID. In addition, PIII or PIIID may be in a middle form of conventional ion implantation and plasma enhanced CVD (PECVD), and by using PIII or PIIID, a phase or layer that cannot be deposited by general PECVD can be formed. In particular, by using PIII or PIIID, a layer having a compact structure at room temperature may be formed. That is, deposition and the like may be performed using a photoresist mask that cannot be used at a high temperature.

Figure 3:
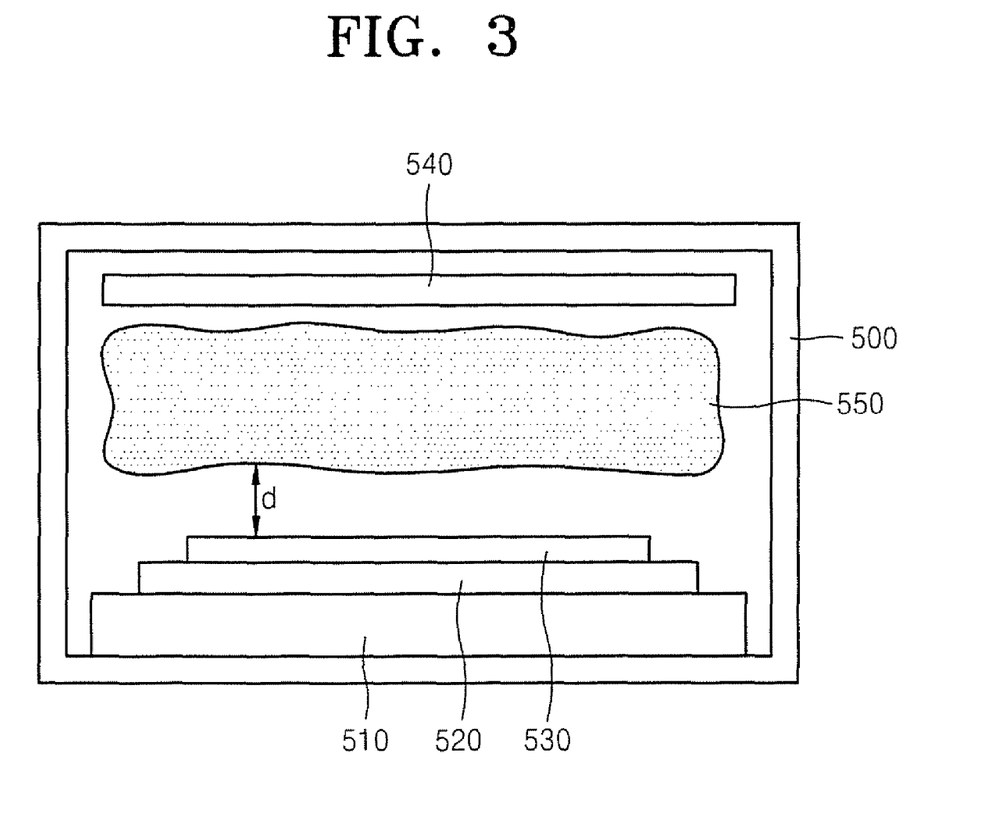
FIG. 3 is a schematic view of a plasma ion immersion implantation deposition device, used to form an STI-type device isolation layer, according to embodiments of the present invention.

FIG. 3 is a schematic view of a plasma ion immersion implantation deposition device, used to form an STI-type device isolation layer, according to some embodiments.

Referring to FIG. 3, the plasma ion immersion implantation deposition device includes a source electrode 540 and a cathode electrode 510 in a chamber 500, a platen 520 disposed between the source and cathode electrodes 540 and 510, and a substrate 530 arranged on the platen 520. A source gas is excited to be plasma 550, and ions in the plasma 550 are implanted into the substrate 530. If a bias voltage is applied to the cathode electrode 510, the ions in the plasma 550 may be accelerated. Accordingly, desired ions to be implanted can be implanted simultaneously into a top surface of the substrate 530. In FIG. 3, d refers to a sheath gap. When a deposition gas is used as the source gas, deposition of a layer, instead of conventional ion implantation, is possible. In addition, when a nitrogen-containing gas is used as the source gas, plasma nitridation at room temperature can be performed. Thus, nitridation may be performed using a photoresist mask that cannot be used at a high temperature. The output of a plasma source may be in a range of 0 to 3000 W, and the bias voltage of the cathode electrode 510 may be in a range of 0 to 10 kV.

Figure 4A:
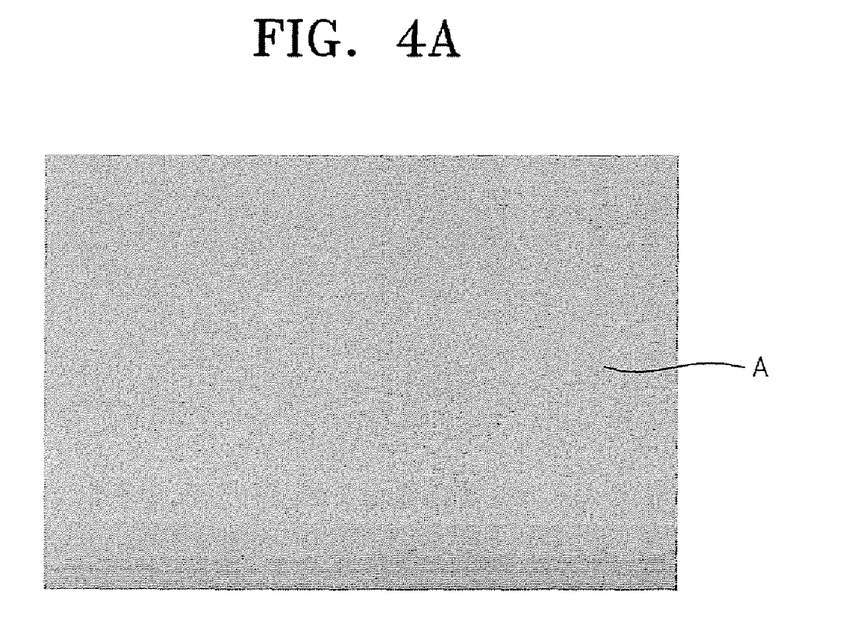
FIGS. 4A and 4B are images showing a surface of a low temperature deposited layer by respectively using plasma enhanced chemical vapor deposition (PECVD) and plasma ion immersion implantation deposition.
Figure 4B:
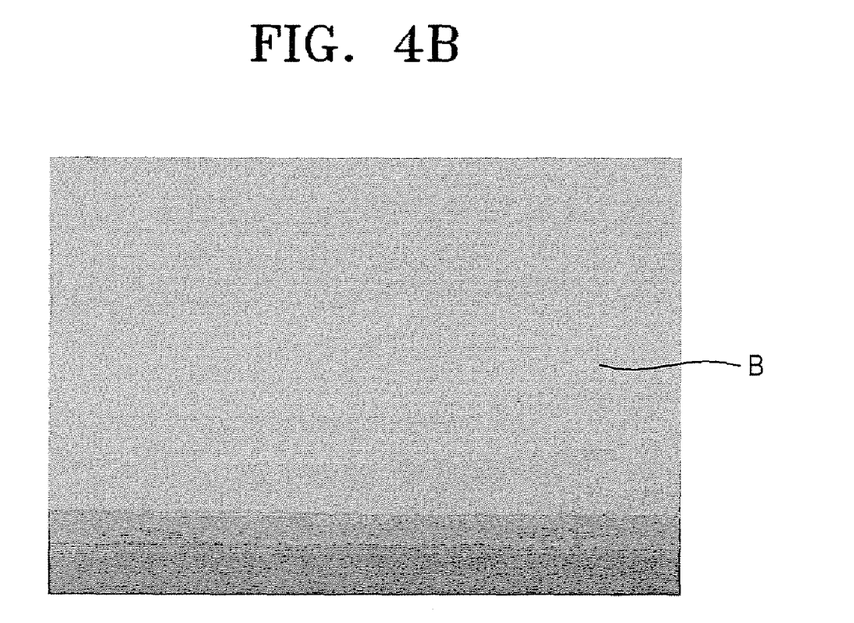

FIGS. 4A and 4B are images showing a surface of a low temperature deposited layer by respectively using plasma enhanced CVD (PECVD) and plasma ion immersion implantation deposition.

Referring to FIGS. 4A and 4B, the surface B of the layer formed by plasma ion immersion implantation deposition is more compact than the surface A of the layer formed by PECVD. Such a compact layer may be formed by optimizing a flow amount of the source gas, the output of the plasma source and the applied bias voltage of the cathode electrode in the plasma ion immersion implantation deposition. Thus, unlike a conventional PECVD, the layer having such a compact structure may be formed even at a low temperature by using the plasma ion immersion implantation deposition.

Figure 5:
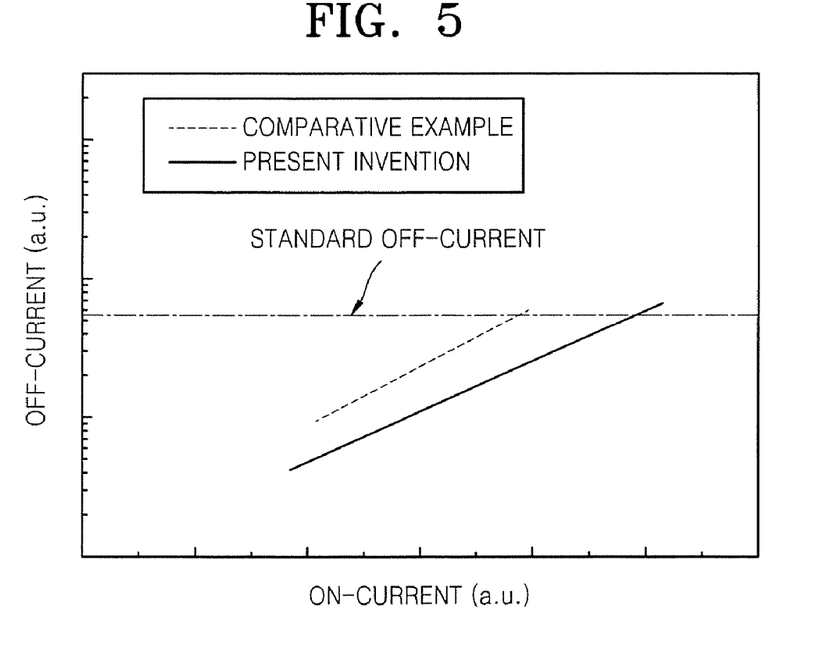
FIG. 5 is a graph showing a change in off-current with respect to on-current of a semiconductor device including an STI-type device isolation layer, according to embodiments of the present invention.

FIG. 5 is a graph showing a change in off-current with respect to on-current of a semiconductor device including an STI-type device isolation layer, according to some embodiments of the present invention. In FIG. 5, only the case of p-MOS is illustrated. In general, an on-current value of a device refers to values at a standard off-current value. That is, as the on-current value at the same standard off-current value is larger, this means that the on-current value is increased. In FIG. 5, the standard off-current value is also illustrated.

Referring to FIG. 5, as compared with Comparative Example in which device isolation layers of a p-MOS region include liner nitride layers therein, the semiconductor device of the present invention in which liner nitride layers (or oxynitride layers) are selectively formed in device isolation layers of only the n-MOS region and are not formed in device isolation layers of the p-MOS region, have an increased p-MOS on-current yield. This increase is attributed to an increase in charge mobility, and a signal transmission delay time is shortened according to an improvement in the on-current of the device. As a result, a semiconductor device according to embodiments of the present invention can have improved performance. When the liner nitride layer is not included, compressive stress is increased, and thus the p-MOS on-current was increased by about 20%. On the other hand, when the liner nitride layer is included, tensile stress is increased, and the n-MOS on-current is increased by about 9%. Thus, if the liner nitride layer is selectively formed with respect to the p-MOS transistor and the n-MOS transistor, characteristics of both transistors can be improved.

Figure 6:
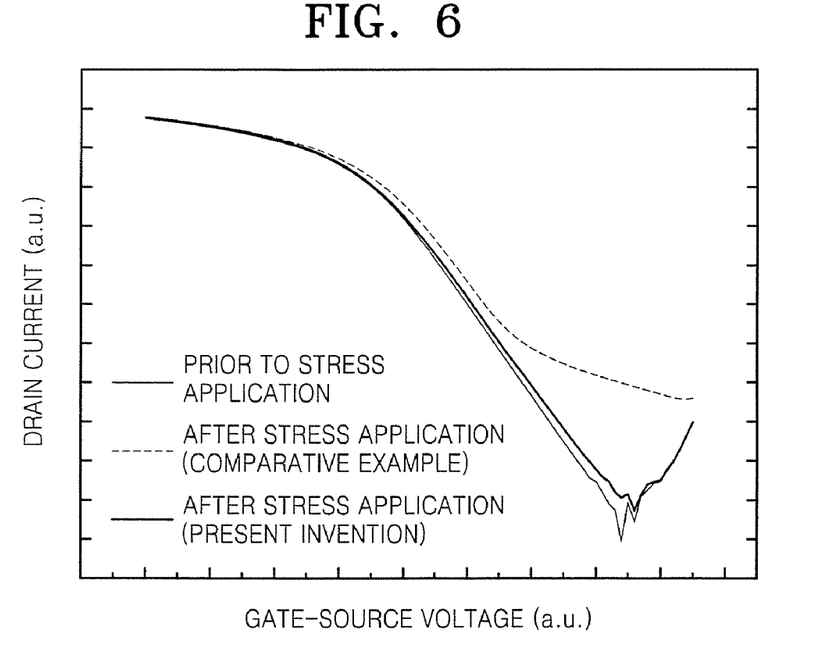
FIG. 6 is a graph showing a change in drain current with respect to gate-source voltage of a semiconductor device including an STI-type device isolation layer, according to embodiments of the present invention.

FIG. 6 is a graph showing a change in drain current with respect to gate-source voltage of a semiconductor device including an STI-type device isolation layer, according to some embodiments of the present invention.

Referring to FIG. 6, in the case of Comparative Example in which device isolation layers of a p-MOS region include liner nitride layers therein, an off-current of a drain with respect to a gate-source voltage after stress application is higher, as compared with prior to stress application, which means that the characteristics of the device may be degraded due to hot electron induced punch through (HEIP). On the other hand, in the case of the present invention in which the liner nitride layer (or oxynitride layer) is not formed in device isolation layers of the p-MOS region, there is less change between the off-current of the drain prior to stress application and the off-current of the drain after stress application, which means that the reliability of the device may be improved.

When the liner nitride layer is removed by using conventional dry etching, it may be difficult to uniformly etch the liner nitride layer, because the dry etching is anisotropic in nature. On the other hand, if the liner nitride layer is removed by conventional wet etching, the wet etching is performed by performing phosphoric acid stripping at a high temperature, and thus photoresist cannot be used as a mask. In addition, in the two cases, the pad insulating layers 112 of the pMOS may be damaged during the etching of the nitride layer as described above, and a difference between the heights of the pad insulating layers 112 of the nMOS and pMOS may occur. Accordingly, a subsequent planarizing process, for example, a CMP process, may not be properly performed. However, in the present invention, the oxynitride layer functioning as the liner nitride layer is selectively formed by deposition, instead of by etching, and thus the uniformity of the oxynitride layer can be improved. In addition, the oxynitride layer can be formed at a low temperature, and thus photoresist can be used as a mask, and damage to other layers, which can be caused by etching, can be reduced.

In methods of manufacturing a semiconductor device according to some embodiments, some of device isolation layers, for example, the device isolation layers that define the active region in the substrate, for forming the p-MOS transistor, may not include a nitride layer or an oxynitride layer, and thus charge traps can be reduced. Accordingly, HEIP can be reduced, and the reliability of the device can be improved. In addition, the nitride layer can be selectively formed in the device isolation layers of only the n-MOS region, and thus the charge mobility and on-current yield of both n-MOS and p-MOS can be improved.

In addition, since the oxynitride layer is formed at a low temperature, relatively simple and inexpensive photoresist patterning technology can be used, and the degradation of the device at high temperature can be decreased.

In addition, in some embodiments, the oxynitride layer may be selectively formed by selective deposition, instead of by conventional etching, and thus damage to other layers, which can be caused by etching, can be reduced or avoided. For example, the pad insulating layers may be damaged during etching of the nitride layer, and a difference between the heights of the pad insulating layers of the n-MOS and the p-MOS may occur, accordingly. Thus, a subsequent planarizing process, such as a CMP process, may not be smoothly performed. In addition, since the oxynitride layer is selectively formed by deposition, instead of by etching, the processes can be relatively simplified.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of manufacturing a semiconductor device, the method comprising:

forming first trenches and second trenches in a substrate;

forming an oxide layer on surfaces of the first trenches and the second trenches;

selectively forming an oxynitride layer on the second trenches using plasma ion immersion implantation (PIII), wherein the oxynitride layer does not extend onto at least portions of the first trenches; and forming an insulating layer in the first trenches and the second trenches;

wherein some of the second trenches comprises third trenches, wherein a first portion of the oxide layer formed on the surface of the third trenches is nitrided to form the oxynitride layer, wherein a second portion of the oxide layer formed on the surface of the third trenches is not nitrided, and wherein third device isolation layers are formed in the third trenches.

2. The method of claim 1, wherein forming the oxynitride layer further comprises:

forming a photoresist pattern on the substrate to expose the second trenches;

nitriding the oxide layer formed on the surface of the exposed second trenches using plasma ion immersion implantation (PIII) to form the oxynitride layer; and removing the photoresist pattern.

3. The method of claim 1, wherein the plasma ion immersion implantation (PIII) is performed at a temperature ranging from 10° C. to 200° C.

4. The method of claim 1, wherein the oxynitride layer is formed as a single layer or a multi-layer in which an oxide layer and a nitride layer are stacked.

5. The method of claim 4, wherein the concentration of nitrogen in the oxynitride layer is variable with respect to the thickness thereof.

6. The method of claim 1, further comprising heat treating the first and second trenches, the oxide layer, and the oxynitride layer in an inert gas atmosphere.

7. The method of claim 1, wherein a region on the substrate between the first device isolation layers comprises a p-channel metal-oxide-semiconductor (p-MOS) region in which a p-MOS transistor is formed, and wherein a region on the substrate between the second device isolation layers comprises an n-channel metal-oxide-semiconductor (n-MOS) region in which an n-MOS transistor is formed.

8. The method of claim 1, wherein regions on the substrate between the first device isolation layers and a portion of the third device isolation layers having the oxide layer and not the oxynitride layer formed therein comprises a p-MOS region in which a p-MOS transistor is formed, wherein regions on the substrate between the second device isolation layers and a portion of the third device isolation layers having the oxynitride layer formed therein comprises an n-MOS region in which an n-MOS transistor is formed.

9. A method of manufacturing a semiconductor device, the method comprising:
   defining a cell region and a peripheral region in a substrate;
   forming first peripheral region trenches and second peripheral region trenches in the peripheral region;
   forming cell region trenches in the cell region;
   forming an oxide layer on surfaces of the first peripheral region trenches, the second peripheral region trenches, and the cell region trenches;
   forming an oxynitride layer on the second peripheral region trenches and the cell region trenches using plasma ion immersion implantation (PIII), wherein the oxynitride layer does not extend onto at least some portions of the first peripheral region trenches;
   forming an insulating layer in the first peripheral region trenches, the second peripheral region trenches, and the cell region trenches; and
   planarizing the insulating layer to form a first peripheral region device isolation layer in the first peripheral region trenches, a second peripheral region device isolation layer in the second peripheral region trenches, and a cell region device isolation layer in the cell region trenches.

10. The method of claim 9, wherein sizes of the first peripheral region trenches and the second peripheral region trenches are larger than a size of the cell region trenches.

11. The method of claim 9, wherein forming the oxynitride layer further comprises:
   forming a photoresist pattern on the substrate to expose the second peripheral region trenches and the cell region trenches;
   nitriding a portion of the oxide layer on the surfaces of the exposed second peripheral region trenches and the cell region trenches by using plasma ion immersion implantation (PIII) to form the oxynitride layer; and
   removing the photoresist pattern.

12. The method of claim 9, wherein the plasma ion immersion implantation (PIII) is performed at a temperature ranging from 10° C. to 200° C.

13. The method of claim 9, wherein the oxynitride layer is formed as a single layer.

14. The method of claim 13, wherein the concentration of nitrogen in the oxynitride layer is uniform with respect to the thickness thereof.

15. The method of claim 9, further comprising heat treating the first peripheral region trenches, the second peripheral region trenches, the cell region trenches, the oxide layer, and the oxynitride layer in a inert gas atmosphere.

16. The method of claim 9, wherein regions on the substrate between the first peripheral region device isolation layers comprise a p-MOS region in which a p-MOS transistor is formed,
   wherein regions on the substrate between the second peripheral region device isolation layers comprise an n-MOS region in which an n-MOS transistor is formed, and
   wherein regions on the substrate between the cell region device isolation layers have an n-MOS region in which an n-MOS transistor is formed.

17. The method of claim 9, wherein some of the second peripheral region trenches comprises third peripheral region trenches, wherein a first portion of the oxide layer formed on the surface of the third peripheral region trenches is nitrided to form the oxynitride layer and a second portion of the oxide layer formed on the surface of the third peripheral region trenches is not nitrided, wherein third device isolation layers are formed in the third peripheral region trenches.

18. The method of claim 17, wherein regions on the substrate between the first peripheral region device isolation layers and a portion of the third peripheral region device isolation layers having the oxide layer and not the oxynitride layer formed therein comprise a p-MOS region in which a p-MOS transistor is formed, and
   wherein regions on the substrate between the second peripheral region device isolation layers and the a portion of third peripheral region device isolation layers having the oxynitride layer formed therein comprise an n-MOS region in which an n-MOS transistor is formed.

19. The method of claim 9, further comprising forming a pad insulating layer on the substrate.

* * * * *